US008716189B2

(12) United States Patent
Sohma et al.

(10) Patent No.: US 8,716,189 B2
(45) Date of Patent: May 6, 2014

(54) METHOD OF PRODUCING SUPERCONDUCTIVE OXIDE MATERIAL

(75) Inventors: Mitsugu Sohma, Tsukuba (JP); Tetsuo Tsuchiya, Tsukuba (JP); Toshiya Kumagai, Tsukuba (JP); Kenichi Tsukada, Tsukuba (JP); Kunihiko Koyanagi, Yokohama (JP); Takashi Ebisawa, Yokohama (JP); Hidehiko Ohtu, Yokohama (JP)

(73) Assignees: National Institute of Advanced Industrial Science and Technology, Tokyo (JP); The Japan Steel Works, Ltd., Tokyo (JP)

( * ) Notice: Subject to any disclaimer, the term of this patent is extended or adjusted under 35 U.S.C. 154(b) by 637 days.

(21) Appl. No.: 12/227,840

(22) PCT Filed: Feb. 5, 2008

(86) PCT No.: PCT/JP2008/051814
§ 371 (c)(1),
(2), (4) Date: Nov. 26, 2008

(87) PCT Pub. No.: WO2008/096728
PCT Pub. Date: Aug. 14, 2008

(65) Prior Publication Data
US 2009/0318296 A1 Dec. 24, 2009

(30) Foreign Application Priority Data
Feb. 8, 2007 (JP) ................................ 2007-029775

(51) Int. Cl.
*H01L 39/24* (2006.01)
*H01B 12/06* (2006.01)
*B05D 5/12* (2006.01)

(52) U.S. Cl.
USPC ........... 505/325; 505/480; 505/470; 505/704; 427/62; 427/63; 427/597; 174/125.1

(58) Field of Classification Search
USPC ......... 505/150, 230, 434, 445, 470, 480, 734, 505/741; 427/62, 126.3, 255.19, 376.2, 427/453, 596
See application file for complete search history.

(56) References Cited

U.S. PATENT DOCUMENTS

| 5,310,990 A * | 5/1994 | Russell et al. ........... 219/121.69 |
| 2004/0033319 A1* | 2/2004 | Yamada et al. ............... 427/558 |

FOREIGN PATENT DOCUMENTS

| JP | 64-035806 | * | 2/1989 | ............. H01B 13/00 |
| JP | 01-294506 | * | 11/1989 | ............. C01B 13/34 |

(Continued)

OTHER PUBLICATIONS

Sohma et al, "Preparation of Epitaxial YBCO Films by a Novel Excimer-Laser-Assisted MOD," IEEE Trans. Appl.Superconduct., 2007, V17, No. 2, pp. 3612-3616.*
Sohma et al, "Preparation of Epitaxial YBCO Films by a Novel Excimer-Laser-Assisted MOD," IEEE Transactions on Applied Superconductivity, vol. 17, No. 2, Jun. 2007, pp. 3612-3615.*

Primary Examiner — Stanley Silverman
Assistant Examiner — Kallambella Vijayakumar
(74) Attorney, Agent, or Firm — Flynn, Thiel, Boutell & Tanis, P.C.

(57) ABSTRACT

A method of producing a superconductive material involves the step (1) of applying a solution of an organic compound of metals, oxides of the metals forming a superconductive material, onto a support body to be subsequently dried, a provisional baking step (2) of causing organic components of the organic compound of the metals to undergo thermal decomposition, and a main baking process step (3) of causing transformation of the oxides of the metals into the superconductive material, thereby producing an epitaxially-grown superconductive coating material, wherein at the time of irradiation of a surface of the support body coated with the solution of the organic compound of the metals for forming the superconductive material, and/or of a surface of the support body, opposite to the surface coated with the solution of the organic compound of the metals, with the laser light, during a period between the steps (1) and (2).

11 Claims, 8 Drawing Sheets

(56) References Cited

FOREIGN PATENT DOCUMENTS

| | | | | |
|---|---|---|---|---|
| JP | 02258695 | * 10/1990 | ............. | C30B 29/22 |
| JP | 07-106905 | 11/1995 | | |
| JP | 2759125 | 3/1998 | | |
| JP | 2000-256862 | 9/2000 | | |
| JP | 2001-031417 | 2/2001 | | |
| JP | 2003-206134 | * 7/2003 | ............... | C01G 3/00 |
| JP | 2007-070216 | 3/2007 | | |
| WO | WO 2007/018027 | * 2/2007 | ............ | H01B 12/06 |

\* cited by examiner

METHOD OF PRODUCING SUPERCONDUCTIVE OXIDE MATERIAL

TECHNICAL FIELD

The invention relates to a method of producing a superconductive material for use in the fields of power transmission, power equipment, and information equipment, and in particular, to a method of producing a superconductive material film (such as a fault current limiter, a microwave filter, tape material, and cable) coated with a superconductive material.

BACKGROUND TECHNOLOGY

In the past, a substrate has been coated with a solution of an organic compound containing metal elements of which a superconductive material is formed to be subsequently dried (1), and thereafter, a process step (2) (provisional baking) for executing decomposition of organic components, and a process step (3) (main baking) for forming the superconductive material have all been executed by the agency of thermal energy (refer to Patent Document 1).

Further, there has been known a method of producing metal oxides, and metal oxide thin films by use of an excimer laser (refer to Patent Document 2), characterized in that when preparing metal oxides (exhibiting no superconductivity), metal salts of organic acids, or metalorganic compounds $M_mR_n$ (provided that M=Si, Ge, Sn, Pb among the group 4b elements, Cr, Mo, W among the group 6a elements, and Mn, Tc, Re among the group 7a elements; R=an alkyl group such as $CH_3$, $C_2H_5$, $C_3H_7$, $C_4H_5$, etc., a carboxyl group such as $CH_3COO^-$, $C_2H_5COO^-$, $C_3H_7COO^-$, $C_4H_9COO^-$, etc., or a carbonyl group of CO; m, n: integers) are dissolved in a soluble solvent (or if those are in liquid form, as they are), and a solution thus obtained is dispersed and applied over a substrate before the substrate is irradiated in an oxygen atmosphere with an excimer laser light.

Still further, there has been known a method of producing metal oxides, which is a method of producing metal oxides (exhibiting no superconductivity) on a substrate without applying heat treatment at a high temperature unlike a conventional case known as the coating thermal decomposition method, characterized in that metalorganic compounds (metal salts of organic acids, metal-acetylacetonate, metal-alkoxides containing an organic group having 6 or more carbon atoms) are dissolved in a solvent to be turned into a solution, and the substrate is coated with the solution to be subsequently dried, thereby forming metal oxides on the substrate by irradiating the substrate with laser light at a wavelength not more than 400 nm (Patent Document 3).

Herein, there has been described the method of producing metal oxides, characterized in that the metalorganic compounds are dissolved in the solvent to be turned into the solution, and the substrate is coated with the solution to be subsequently dried, thereby forming metal oxides on the substrate by irradiating the substrate with the laser light at a wavelength not more than 400 nm such as, for example, an excimer laser beam selected from the group consisting of excimer laser beams ArF, KrF, XeCl, XeF and $F_2$, and further, it has been described therein that irradiation with the laser light at the wavelength not more than 400 nm is executed in a plurality of stages, and weaker irradiation on the order not to cause complete decomposition of the metalorganic compounds is executed in the initial stage of the irradiation while executing stronger irradiation capable of converting the metalorganic compounds into the metal oxides in the next stage. Further, it is also known that the metalorganic compounds are not less than two kinds of compounds, each containing a different metal, the metal oxides obtained are composite oxides containing various metals, and respective metal constituents of the metal salts of the organic acids are elements selected from the group consisting of iron, indium, tin, zirconium, cobalt, nickel, and lead.

Still further, with a method of producing composite oxide films, whereby a precursor coating liquid containing raw material constituents of respective oxides of La, Mn and any of Ca, Sr and Ba is applied to a surface of a material to be coated to thereby form a film, and subsequently, a thin film formed on the surface of the material to be coated is caused to undergo crystallization to thereby form composite oxide films (exhibiting no superconductivity) having the perovskite structure expressed by a composition formula $(La_{1-x}M_x)MnO_{3-\delta}$ (M: Ca, Sr, Ba, $0.09 \le x \le 0.50$), there has been known a method of producing composite oxide films (refer to Patent Document 4) characterized in that the precursor coating liquid is applied to the surface of the material to be coated to thereby form a film, and subsequently, a thin film formed on the surface of the oxide to be coated is irradiated with light at a wavelength not more than 360 nm to thereby crystallize the thin film.

Herein, it is further described that as a light source for irradiating the thin film formed on the surface of the material to be coated with light, use is made of a third harmonic light of ArF excimer laser, KrF excimer laser, XeCl excimer laser, XeF excimer laser, and YAG laser, or a fourth harmonic light of the YAG laser, and the precursor coating liquid to be applied to the surface of the material to be coated is prepared by mixing and reaction of an alkanolamine coordination compound of La, Mn carboxylate, and metal M or M alkoxide together in a first alcohol having carbon atoms in a range of 1 to 4.

The inventors have been faced with the fact that with the conventional method of producing a superconductive material, a long time was required, the orientation was difficult to control, and further, uniformity underwent deterioration due to the occurrence of a reaction with a support body in practical use when carrying out the thermal decomposition of metalorganic compounds, and formation of a superconductive material by means of heat treatment, and in order to overcome these problems, the inventor has succeeded in finding out a method of efficiently producing a superconductive material having an excellent performance upon execution of the thermal decomposition of the metalorganic compounds and the formation of the superconductive material by means of the heat treatment, and has already submitted a Japanese Patent Application (refer to Patent Document 5).

More specifically, such a method is a method of producing a superconductive material, characterized in that laser light is irradiated between the step of applying a solution of an organic compound containing metals, oxides of the metals forming a superconductive material, onto a support body to be subsequently dried (1), and the provisional baking step of causing organic components of the organic compound containing the metals to undergo thermal decomposition (2).

The superconductive material obtained by the method according to this invention is superior in production efficiency, suitable for mass production, and has an excellent superconductivity, however, in the case of a $YBa_2Cu_3O_7$ (YBCO) film about 100 nm in film thickness, the upper limit of the critical current density has been found on the order of Jc=2.0 MA/cm$^2$ at most. Furthermore, with this invention, only a surface of a substrate, coated with the solution of the organic compound containing the metals for forming the superconductive material on the substrate is simply irradiated with laser light.
Patent Document 1: JP 07-106905-B
Patent Document 2: JP 2759125-W, Specification
Patent Document 3: JP 2001-31417-A
Patent Document 4: JP 2000-256862-A
Patent Document 5: JP application 2006-185934

DISCLOSURE OF THE INVENTION

Problem to be Solved by the Invention

With the conventional method of producing a superconductive material, when carrying out thermal decomposition of a metalorganic compound and forming a superconductive material with a heat treatment, a long time was required, the orientation was difficult to control, and uniformity underwent deterioration due to the occurrence of a reaction with a support body in practical use. It is an object of the present invention to provide a method of efficiently producing a superconductive material having more excellent properties without the occurrence of ablation and so forth, and a large area when executing the thermal decomposition of a metalorganic compound, and the formation of a superconductive material with heat treatment.

Means for Solving the Problem

In order to attain the described object, with the method of producing a superconductive material according to the present invention, a part of a heat treatment process of a coating thermal decomposition method is replaced with irradiation with laser light as shown in FIG. 1. More specifically, in accordance with a first aspect of the invention, there is provided a method of producing a superconductive material comprising the step (1) of applying a solution of an organic compound of metals, oxides of the metals forming a superconductive material, onto a support body to be subsequently dried, the provisional baking step (2) of causing organic components of the organic compound of the metals to undergo thermal decomposition, and the main baking process step (3) of causing transformation of the oxides of the metals into the superconductive material, thereby producing an epitaxially-grown superconductive coating material, wherein at the time of irradiation of a surface of the support body coated with the solution of the organic compound of the metals for forming the superconductive material, and/or of a surface of the support body, opposite to the surface coated with the solution of the organic compound of the metals, with the laser light, during a period between the steps (1) and (2), it is executed under the conditions adopting the following range.

intensity and the number of pulses of the laser light;

5 mJ/cm$^2$ ≤ intensity of the laser light $F$ ≤ 200 mJ/cm$^2$

1 ≤ the number of pulses $P$ ≤ 198000000 total energy of the laser light;

(0.03 J/cm$^2$ × a substrate constant) ≤ total energy ≤ (89000 J/cm$^2$ × a substrate constant)

(in the expression, the substrate constant is defined as a number not less than 1 in value, depending on the nature and thickness of the support body)

an irradiation condition area surrounded by a straight lines having the following equations;

$$\log_{10}P = K^1 F + K^2$$

$$\log_{10}P = K^1 F + K^3$$

(in the equations, $K^1$ represents a slope of a line connecting between a point F corresponding to an arbitrary point P where transformation into the superconductive material occurs first and a point P corresponding to an arbitrary point F where transformation into the superconductive material occurs first, $K^2$ is a logarithmic value at the point P in F=0 where a value at the point P in F=5 where transformation into the superconductive material occurs first is outwardly inserted along the slope $K^1$, and $K^3$ is a logarithmic value at the point P in F=0 where a value at the point P in F=5 where ablation occurs first is outwardly inserted along the slant $K^1$, where $K^3 > K^2$ is established).

Further, with the present invention, as the support body, selection may be made of one single crystal substrate selected from the group consisting of lanthanum aluminate (LaAlO$_3$) substrate, strontium titanate (SrTiO$_3$) substrate, lanthanum-strontium-tantalum-aluminum oxide ((La$_x$Sr$_{1-x}$)(Al$_x$Ta$_{1-x}$)O$_3$) substrate, neodymium gallate (NdGaO$_3$) substrate, and yttrium aluminate (YAlO$_3$). As the single crystal substrates, a substrate having a lattice constant that is similar to that of the superconductive material is selected so that the superconductive material can be excellently epitaxially grown on the substrate.

Still further, with the present invention, as the support body, selection may be made of one single crystal substrate selected from the group consisting of an aluminum oxide (Al$_2$O$_3$) substrate, a yttria-stabilized zirconia ((Zr,Y)O$_2$, YSZ) substrate, a magnesium oxide (MgO) substrate, the lanthanum aluminate (LaAlO$_3$) substrate, the strontium titanate (SrTiO$_3$) substrate, a lanthanum-strontium-tantalum-aluminum oxide ((La$_x$Sr$_{1-x}$)(Al$_x$Ta$_{1-x}$)O$_3$) substrate, the neodymium gallate (NdGaO$_3$) substrate, and the yttrium aluminate (YAlO$_3$) substrate, each with a cerium oxide (CeO$_2$) buffer layer formed thereon. As the buffer layer, a buffer layer having a lattice constant that is similar to that of the superconductive material is selected so that the superconductive material can be excellently epitaxially grown on the buffer layer.

Yet further, with the present invention, as metals, oxides thereof forming a superconductive material, selection can be made of at least one element selected from the group consisting of RE (RE refers to Y and rare earth element), and AE (AE refers to alkaline earth metals), respectively, and Cu.

Still yet further, with the present invention, as the organic compound of metals, use may be made of at least one organic compound selected from the group consisting of β-diketonate, metal-alkoxides, and metal salts of organic acids and can include a halogen.

In the case of irradiation of a surface of the support body, opposite from the surface coated with the solution of the organic compound of metals forming the superconductive material, with the laser light, it is preferable that the support body is a single crystal substrate selected from a group consisting of lanthanum aluminate (LaAlO$_3$) or yttrium aluminate (YAlO$_3$). As the single crystal substrates, it is preferable to select a substrate having a lattice constant that is similar to that of the superconductive material and low rate of laser light attenuation so that the superconductive material can be excellently epitaxially grown on the substrate.

In the case of irradiation of a surface of the support body, opposite from the surface coated with the solution of the organic compound of metals forming the superconductive material, with the laser light, it is preferable that the support body is a substrate with a cerium oxide ($CeO_2$) buffer layer formed on a single crystal substrate selected from a group consisting of aluminum oxide ($Al_2O_3$) and magnesium oxide (MgO). As the buffer layer, it is preferable to select a buffer layer having a lattice constant that is similar to that of the superconductive material so that the superconductive material can be excellently epitaxially grown on the buffer layer. Further, it is preferable that the buffer layer and single crystal substrates are selected from those having a low rate of laser light attenuation.

Further, in the case of irradiation of a surface of the support body, opposite from the surface coated with the solution of the organic compound of metals forming the superconductive material, with the laser light, it is preferable that as the metals, oxides thereof forming a superconductive material, to select at least one element selected from the group consisting of RE (RE refers to Y and rare earth element), and AE (AE refers to alkaline earth metals), respectively, and Cu. Herein, as the organic compound of metals, it is preferable that at least one organic compound selected from the group consisting of β-diketonate, metal-alkoxides, and metal salts of organic acids that can also include a halogen.

Effect of the Invention

According to the method of producing a superconductive material, since it has been found that two straight lines have the same slope due to the equations of $\log_{10}P=K^1F+K^2$ and $\log_{10}P=K^1F+K^3$, the range where the ablation occurs can be predicted with ease, so that the optimum conditions can be found with ease, thereby obtaining a superconductive material having an excellent production efficiency suitable for mass production and capable of providing a superconductive material of superconductivity which is significantly improved and has a large area.

BEST MODE FOR CARRYING OUT THE INVENTION

Figure 1:
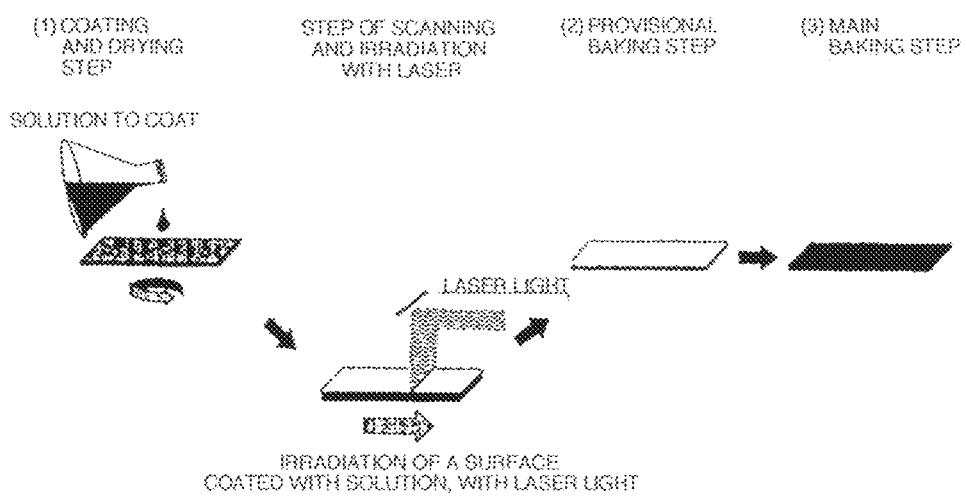
FIG. 1 is a schematic illustration showing a method of producing a superconductive material according to the present invention (in the case of irradiation of a surface of a support body coated with a solution with the laser light)

FIG. 1 shows a typical embodiment according to the present invention. In the figure, there is shown a method of producing a superconductive material, comprising the steps of applying a solution of an organic compound of metals for forming a superconductive material to a surface of a support body, and irradiating the surface of the support body, coated with the solution of the organic compound of the metals for forming the superconductive material, with laser light, at the time of irradiation of the support body with the laser light during a period between a drying process step and a provisional baking process step, wherein it is characterized in that the intensity of the laser light, the number of pulses and total energy (=the intensity of the laser light×the number of pulses×a substrate constant; the substrate constant depends on the support body. In the case of irradiation of a coated surface with laser light, the substrate constant=1) are in a specific range.

In the case of irradiation of the surface coated with the solution of the organic compound of the metals forming the superconductive material, with the laser light, a film coated with the solution of the organic compound of the metals forming the superconductive material does not disappear due to ablation provided that conditions in the following range are adopted:

intensity and the number of pulses of the laser light;

$5\ mJ/cm^2 \leq$ intensity of the laser light $\leq 50\ mJ/cm^2$ $1 \leq$ the number of pulses $\leq 17800000$ total energy of the laser light;

$(0.03\ J/cm^2 \times$ a substrate constant$) \leq$ total energy $\leq (89000\ J/cm^2 \times$ a substrate constant$)$ an irradiation condition area surrounded by the straight lines having the following equations;

$\log_{10}P=K^1F+K^2$ $\log_{10}P=K^1F+K^3$ (in the equations, $K^1$ represents the slope of a line between a point F corresponding to an arbitrary point P where transformation into the superconductive material occurs first and a point P corresponding to an arbitrary point F where transformation into the superconductive material occurs first, $K^2$ is a logarithmic value at the point P in F=0 where a value at the point P in F=5 where transformation into the superconductive material occurs first is outwardly inserted along the slope $K^1$, and $K^3$ is a logarithmic value at the point P in F=0 where a value at the point P in F=5 where ablation occurs first is outwardly inserted along the slope $K^1$, where $K^3>K^2$ is established).

Figure 6:
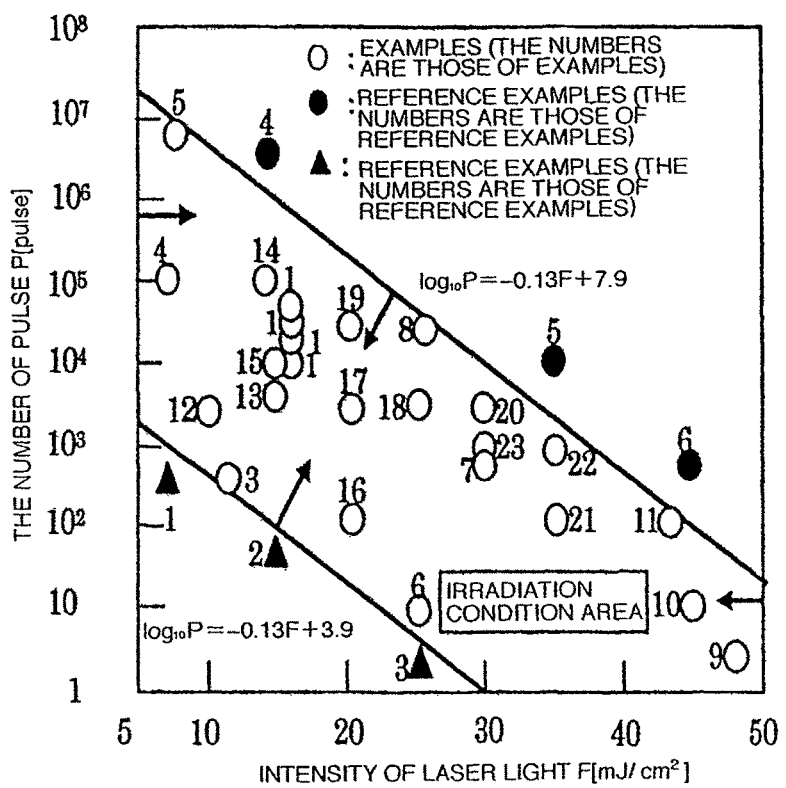
FIG. 6 is a view showing an irradiation condition area when irradiating a surface of the support body coated with a solution with the laser light.

In the embodiments 1 to 23 and comparative examples 1 to 6, the straight lines having the following equations are obtained, as shown in FIG. 6.

$\log_{10}P=-0.13F+3.9$ $\log_{10}P=-0.13F+7.9$

With the present invention, the substrate constant is defined as a number not less than 1 in value, dependent on the material and thickness of the support body, and assuming that the substrate constant in the case of irradiation of the surface coated with the solution of the organic compound of the metals forming the superconductive material with the laser light is 1, the substrate constant in the case of irradiation of a surface of the support body, opposite from the surface coated with the solution of the organic compound of the metals forming the superconductive material, with the laser light, is equal to a multiple number of the total energy for obtaining the same effect as is obtained in the case of irradiation of the surface coated with the solution, with the laser light.

Figure 2:
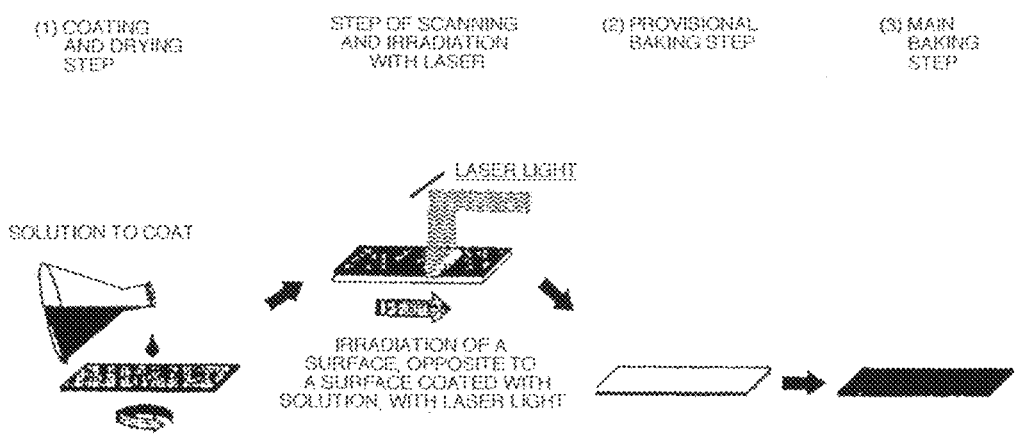
FIG. 2 is a schematic illustration showing a method of producing a superconductive material according to the present invention (in the case of irradiation of a surface of the support body, opposite from the surface coated with a solution, with the laser light)

A typical embodiment of the invention is now described with reference to FIG. 2.

In the case of irradiation of a surface of the support body, opposite to the surface coated with the solution of the organic compound of the metals forming the superconductive material, with the laser light, a film coated with the solution of the organic compound of the metals forming the superconductive material does not disappear due to ablation provided that conditions in the following range are adopted:

intensity and the number of pulses of the laser light;

$$5 \text{ mJ/cm}^2 \leq \text{intensity of the laser light } F \leq 200 \text{ mJ/cm}^2$$

$$1 \leq \text{the number of pulses } P \leq 198000000$$

total energy of the laser light;

$$(0.03 \text{ J/cm}^2 \times \text{a substrate constant}) \leq \text{total energy} \leq (89000 \text{ J/cm}^2 \times \text{a substrate constant})$$

an irradiation condition area surrounded by the straight lines having the following equations;

$$\log_{10}P = K^1F + K^2$$

$$\log_{10}P = K^1F + K^3$$

(in the equations, $K^1$ represents the slope of a line between a point F corresponding to an arbitrary point P where transformation into the superconductive material occurs first and a point P corresponding to an arbitrary point F where transformation into the superconductive material occurs first, $K^2$ is a logarithmic value at the point P in F=0 where a value at the point P in F=5 where transformation into the superconductive material occurs first is outwardly inserted along the slope $K^1$, and $K^3$ is a logarithmic value at the point P in F=0 where a value at the point P in F=5 where ablation occurs first is outwardly inserted along the slant $K^1$, where $K^3 > K^2$ is established).

In the case of irradiation of the surface of the support body, opposite to the surface coated with the solution of the organic compound of the metals forming the superconductive material, with the laser light, the substrate constant becomes a number more than 1 in value.

For example, in the case that the laser light is a KrF excimer laser and the support body is formed of a substrate with a cerium oxide ($CeO_2$) buffer layer formed on a commercially available substrate of the R-plane (0.5 mm in thickness, single-sided polish) of an aluminum oxide ($Al_2O_3$) single crystal (sapphire), the substrate constant is 12, and the total energy ranges as follows, while the film made of the solution of the organic compound of the metals forming the superconductive material does not disappear due to ablation.

$$0.36 \text{ J/cm}^2 \leq \text{total energy} \leq 1068000 \text{ J/cm}^2$$

Figure 7:
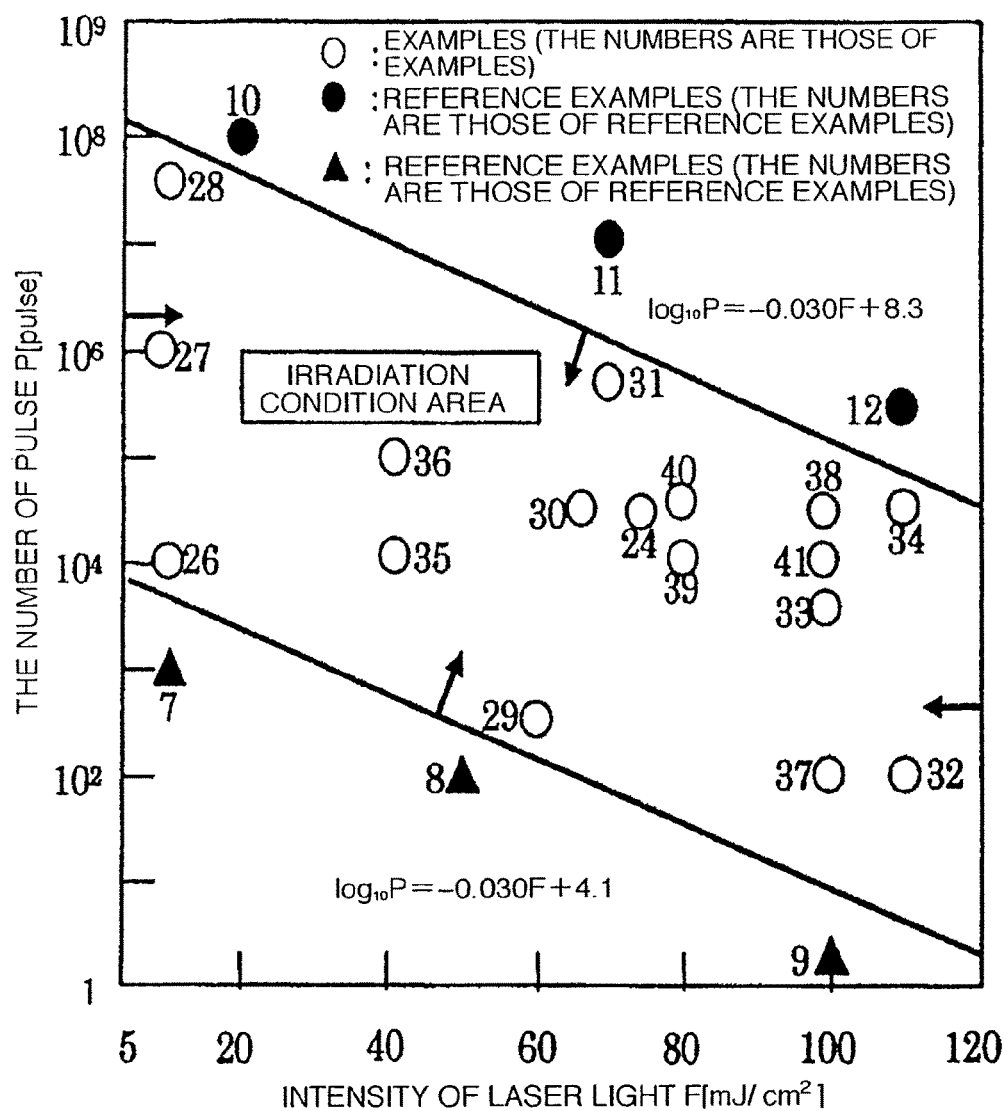
FIG. 7 is a view showing the irradiation condition area when irradiating a surface of the support body, opposite from the surface coated with a solution, wherein substrate KC 1 (a substrate with a cerium oxide buffer layer formed on a substrate of an sapphire R-plane)

In the embodiments 24 to 41 and comparative examples 7 to 12, straight lines having the following equations are obtained, as shown in FIG. 7.

$$\log_{10}P = -0.030F + 4.1$$

$$\log_{10}P = -0.030F + 8.3$$

Further, in the case that the laser light is a KrF excimer laser and the support body is formed of a substrate (0.5 mm in thickness, single-sided polish) of a lanthanum aluminate ($LaAlO_3$) single crystal, the substrate constant is about 18.8, and the total energy ranges as follows, while the film made of the solution of the organic compound of the metals forming the superconductive material does not disappear due to ablation.

$$0.6 \text{ J/cm}^2 \leq \text{total energy} \leq 1673000 \text{ J/cm}^2$$

Figure 8:
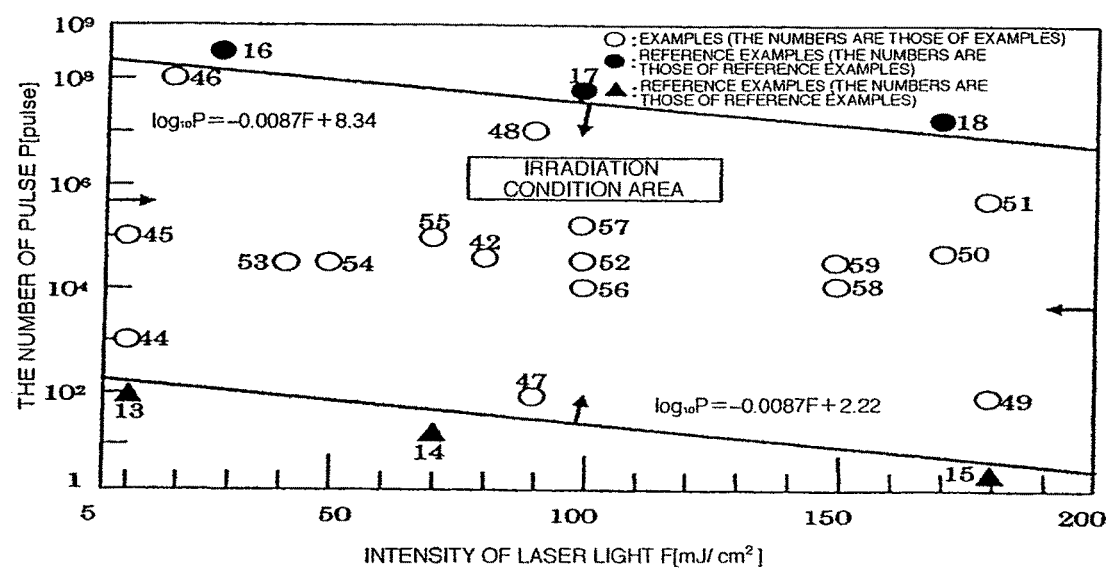
FIG. 8 is a view showing the irradiation condition area when irradiating a surface of the support body, opposite from the surface coated with a solution, wherein substrate K 1 (a lanthanum aluminate (100) substrate).

In the embodiments 42 to 59 and comparative examples 13 to 18, straight lines having the following equations are obtained, as shown in FIG. 8.

$$\log_{10}P = -0.0087F + 2.22$$

$$\log_{10}P = -0.0087F + 8.34$$

With the present invention, it has been confirmed that the irradiation of the organic compound with the laser light in the range set forth above has an effect of cleaving molecular bonds of the organic compound, and the inventors have found first that such an effect is very effective in the production of a superconductive material having a high superconductivity. Meanwhile, the superconductivity is represented by a critical current density Jc. The critical current density is defined as the amount of maximum current value which can be applied to a superconductor per unit section 1 $cm^2$ with zero resistance. Since the higher the current value is, the more the current is applied with zero resistance, the critical current density is the most important superconductivity indicator from a practical standpoint of the superconductive thin film.

For example, a substrate is spin-coated with a solution of an organic compound of metals to be dried at 130° C. in a constant-temperature oven for removal of a solvent, and subsequently, a specimen is fitted to a specimen holder inside a laser chamber, thereafter scanning and irradiating a coated surface with a laser light at room temperature in the ambient atmosphere, or while controlling an atmosphere or temperature.

Figure 3:
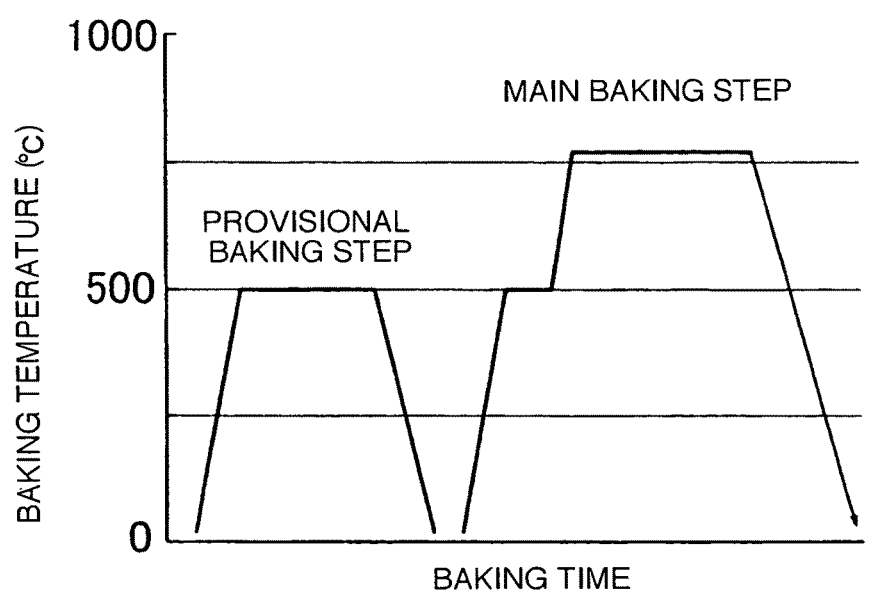
FIG. 3 is a diagram showing an example of a temperature profile in a baking process after a coating and drying process according to the present invention.

A baking process according to the present invention is broadly classified into respective steps of a drying step, a provisional baking step, and a main baking initial step, and FIG. 3 shows a temperature profile as a typical example although conditions of the respective steps vary on a case-by-case basis.

In the case of fabricating, for example, a YBCO film by scanning and irradiating a film coated with a metalorganic compound, and dried with a laser light, and further, by applying an adequate heat treatment to a film irradiated with the laser light, the following effect has been confirmed.

More specifically, it has turned out that if unidirectional scanning and irradiation is executed with laser light in a front-end stage of the provisional baking step (2) for causing the organic components of the organic compound of the metals to undergo thermal decomposition after the step of applying a solution of the metalorganic compound for generating YBCO onto a support body to be subsequently dried (1), this will promote decomposition of the organic components at a low temperature.

In the case of a conventional coating thermal decomposition method, it has been known that it takes long time to cause a thermal decomposition reaction of the metalorganic compounds as a raw material for YBCO, however, it has been confirmed that with a method of producing a superconductive material, according to the present invention, the time required in a thermal decomposition reaction process can be shortened.

The variation with time of the decomposition reaction occurring in a solution of the raw material for YBCO which was applied to the substrate and dried to form a film, caused by an excimer laser, was measured by Fourier transform infrared spectroscopy.

Figure 4:
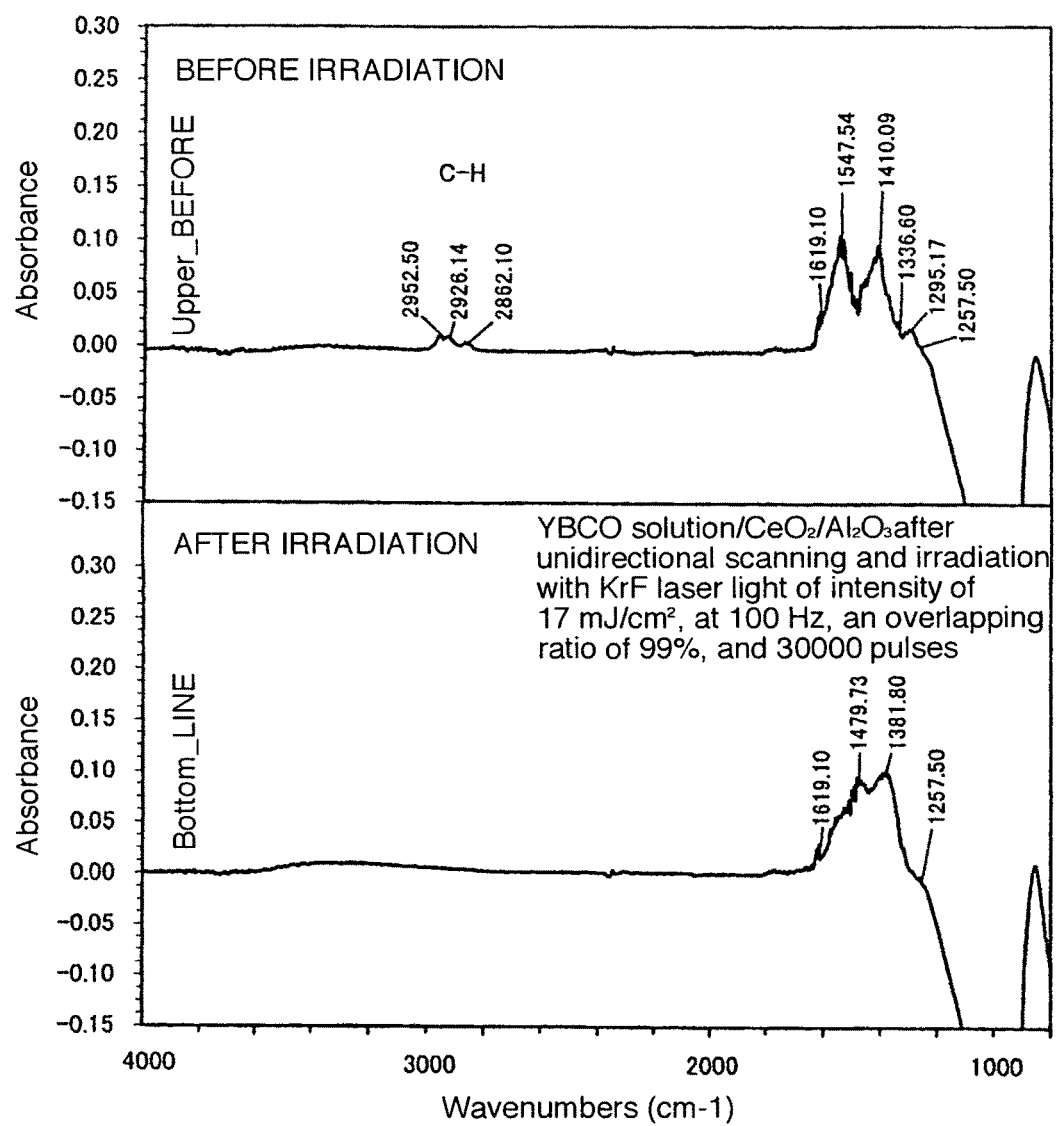
FIG. 4 is a diagram showing results of an analysis made on a film irradiated with laser light after the coating and drying process according to the present invention, made with the use of infrared spectroscopy.

The results of the measurement are shown in FIG. 4. The absorbance peak of C—H oscillation in the vicinity of 3000 $cm^{-1}$, pronouncedly seen before irradiation, disappeared after unidirectional scanning and irradiation with a KrF excimer laser with the intensity of 17 $mJ/cm^2$, at 100 Hz, an overlap ratio 99%, and 30000 pulses, thereby proving that the scanning and irradiation with the laser light was effective in decomposition of the metalorganic compounds.

Now, embodiments of the present invention are described in more details hereinafter, however, it is to be pointed out that the present invention be not limited to those embodiments.

Substrates and solutions for raw material, used in carrying out the embodiments of the present invention, are described as follows.

(1) A Substrate (K1): a commercially available substrate of lanthanum aluminate ($LaAlO_3$) (100), a substrate (K2): a commercially available substrate of strontium titanate ($SrTiO_3$) (100), a substrate (K3): a commercially available substrate of lanthanum-strontium-tantalum-aluminum oxide $\{(La_xSr_{1-x})(Al_xTa_{1-x})O_3\}$ (100), a substrate (K4): a commercially available substrate of neodymium gallate ($NdGaO_3$) (110), a substrate (K5): a commercially available substrate of yttrium aluminate ($YAlO_3$) (110), a substrate (KC1): a substrate with a cerium oxide ($CeO_2$) buffer layer formed on a commercially available substrate of the R-plane of an aluminum oxide ($Al_2O_3$) single crystal (sapphire), a substrate (KC2): a substrate with a cerium oxide ($CeO_2$) buffer layer formed on a commercially available substrate of yttria stabilized zirconia $\{(Zr,Y)O_2, YSZ\}$ (100), a substrate (KC3): a substrate with a cerium oxide ($CeO_2$) buffer layer formed on a commercially available substrate of magnesium oxide (MgO) (100), a substrate (KC4): a substrate with a cerium oxide ($CeO_2$) buffer layer formed on a commercially available substrate of $LaAlO_3$ (100), a substrate (KC5): a substrate with a cerium oxide ($CeO_2$) buffer layer formed on a commercially available substrate of $SrTiO_3$ (100), a substrate (KC6): a substrate with a cerium oxide ($CeO_2$) buffer layer formed on the commercially available substrate of $\{(La_xSr_{1-x})(Al_xTa_{1-x})O_3\}$ (100), a substrate (KC7): a substrate with a cerium oxide ($CeO_2$) buffer layer formed on the commercially available substrate of $NdGaO_3$ (110), and a substrate (KC8): a substrate with a cerium oxide ($CeO_2$) buffer layer formed on the commercially available substrate of $YAlO_3$ (110)

The buffer layer can be formed by use of any of layer-forming means including, for example, vapor deposition, sputtering, pulsed laser deposition, a coating thermal decomposition method, coating photodecomposition method, sol-gel method, and so forth.

(2) A Raw Material Solution (Y1): a solution obtained by dissolving acetylacetonate containing Y:Ba:Cu at a mole ratio of 1:2:3 into a mixed liquid of pyridine and propionic acid, and removing most of solvent at about 80° C. by use of a vacuum evaporator before re-dissolution into methanol, (YC1): a solution prepared by substituting acetylacetonate containing Y:Ca:Ba:Cu at the mole ratio of 0.95:0.05:2:3 for the acetylacetonate in the solution (Y1) containing Y:Ba:Cu at the mole ratio of 1:2:3, (Y2): a solution obtained by mixing a toluene solution of salts of Y, Ba, Cu of naphthenic acid such that Y:Ba:Cu will be at the mole ratio of 1:2:3, (Y3): a solution obtained by mixing a toluene solution of 2-ethylhexanoates of Y, Ba, Cu such that Y:Ba:Cu will be at the mole ratio of 1:2:3, (Y4): a solution prepared by substituting trifluoroacetic acid for propionic acid in the solution (Y1), (Y5) a solution obtained by mixing a methanol solution of trifluoroacetates of Y, Ba, Cu such that Y:Ba:Cu will be at the mole ratio of 1:2:3, (D1) a solution prepared by substituting Dy-acetylacetonate for Y-acetylacetonate in the solution Y1, (E1) a solution prepared by substituting Er-acetylacetonate for Y-acetylacetonate in the solution Y1.

(3) Laser Light (H1) KrF excimer laser light, (H2) XeCl excimer laser light, (H3) ArF excimer laser light.

Example 1

A surface of the substrate KC1 was spin-coated at 4000 rpm with the coating solution Y1 for 10 seconds, was dried at 130° C. in a constant-temperature oven for removal of a solvent and subsequently irradiated with the laser light H1 at room temperature. At this point in time, the irradiation was executed with the intensity of laser light of 16.4 $mJ/cm^2$, while unidirectional scanning at respective pulses 10000, 20000, 30000, and 40000.

Other irradiation conditions were as follows:
room temperature in the ambient atmosphere
frequency: 100 Hz;
overlapping ratio: 99%

Subsequently, a specimen of the substrate KC1, subjected to the irradiation with the laser light, was inserted into a muffle oven kept at 500° C. beforehand, and was kept at that temperature for 30 minutes before being taken out.

Figure 5:
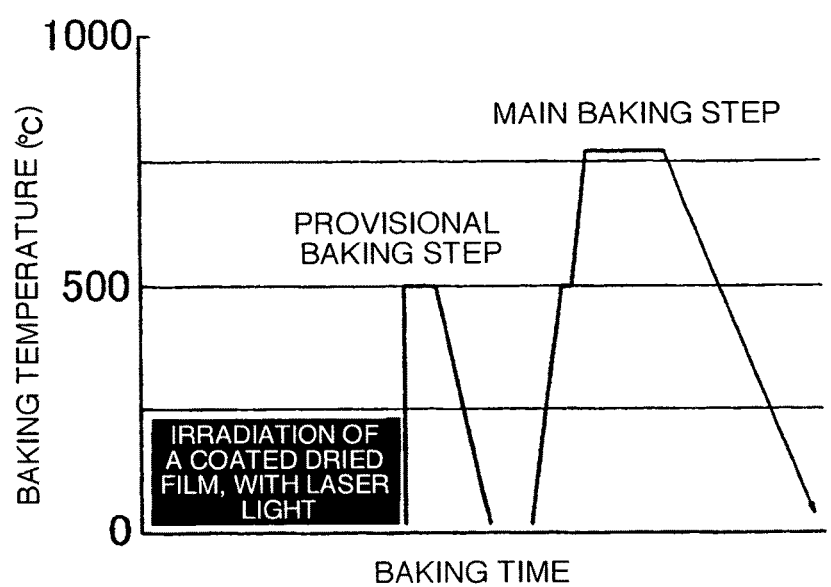
FIG. 5 is a diagram showing a temperature profile in a laser irradiation process, and the baking process after the coating and drying process.

Thereafter, main baking was applied thereto in a quartz furnace tubular in shape under the following condition. First, the specimen in a flow of a mixed gas of argon and oxygen with a partial pressure of oxygen adjusted at 100 ppm was heated up to 770° C. at a heating rate of about 16° C./min, and that temperature was kept for 45 minutes before the gas was changed over to pure oxygen to be then held for a further 30 minutes, after which the specimen was slowly cooled. FIG. 5 shows a temperature profile in those process steps described. With a YBCO film about 100 nm in film thickness fabricated as above, Jc shown in Table 1 was obtained.

TABLE 1

| the number of pulses | Jc ($MA/cm^2$) |
|---|---|
| 10000 | 1.2 |
| 20000 | 2.9 |

TABLE 1-continued

| the number of pulses | Jc (MA/cm$^2$) |
|---|---|
| 30000 | 6.4 |
| 40000 | 5.9 |

In the case of the number of pulses being at 30000, in particular, a total energy of 492 J/cm$^2$ and excellent Jc=6.4 MA/cm$^2$ by the inductive method were exhibited. This represented a value considerably in excess of 2.0 to 3.0 MA/cm$^2$, regarded as the level in practical use. There was observed a tendency that Jc was found on the increase along with an increase in the number of pulses. The surface of the coated film after irradiated with the laser light was observed with the optical microscope, and as a result, rhombus-like cracks on the order of 10 μm were observed.

Example 2

For comparison, with a YBCO film about 100 nm in film thickness produced in the same way as in the case of Example 1 except that the irradiation with the laser light was not executed, the critical current density Jc by the inductive method was found at a measurement limit (0.1 MA/cm$^2$) or lower.

Example 3

With a YBCO film about 100 nm in film thickness produced in the same way as in the case of Example 1 except that the irradiation was executed with the intensity of laser light of 11 mJ/cm$^2$, the number of pulses at 500 and total energy of 5.5 J/cm$^2$, there was obtained a critical current density Jc=1.1 MA/cm$^2$ by the inductive method.

Example 4

With a YBCO film about 100 nm in film thickness produced in the same way as in the case of Example 1 except that the irradiation was executed with the intensity of laser light of 6 mJ/cm$^2$, the number of pulses at 100000 and a total energy of 600 J/cm$^2$, there was obtained Jc=6.8 MA/cm$^2$ by the inductive method.

Example 5

With a YBCO film about 100 nm in film thickness produced in the same way as in the case of Example 1 except that irradiation was executed with the intensity of laser light of 7 mJ/cm$^2$, the number of pulses at 9500000 and a total energy of 66500 J/cm$^2$, there was obtained Jc=5.5 MA/cm$^2$ by the inductive method.

Example 6

With a YBCO film about 100 nm in film thickness produced in the same way as in the case of Example 1 except that the irradiation was executed with the intensity of laser light of 25 mJ/cm$^2$, the number of pulses at 10, a total energy of 0.25 J/cm$^2$ and overlapping ratio at 90%, there was obtained Jc=0.5 MA/cm$^2$ by the inductive method.

Example 7

With a YBCO film about 100 nm in film thickness produced in the same way as in the case of Example 1 except that the irradiation was executed with the intensity of laser light of 30 mJ/cm$^2$, the number of pulses at 300 and a total energy of 9 J/cm$^2$, there was obtained Jc=1.5 MA/cm$^2$ by the inductive method.

Example 8

With a YBCO film about 100 nm in film thickness produced in the same way as in the case of Example 1 except that the irradiation was executed with the intensity of laser light of 26 mJ/cm$^2$, the number of pulses at 20000 and a total energy of 520 J/cm$^2$, there was obtained Jc=6.8 MA/cm$^2$ by the inductive method.

Example 9

With a YBCO film about 100 nm in film thickness produced in the same way as in the case of Example 1 except that irradiation was executed with the intensity of laser light of 48 mJ/cm$^2$, the number of pulses at 2, a total energy of 0.10 J/cm$^2$ and overlapping ratio at 50%, there was obtained Jc=1 MA/cm$^2$ by the inductive method.

Example 10

With a YBCO film about 100 nm in film thickness produced in the same way as in the case of Example 1 except that the irradiation was executed with the intensity of laser light of 45 mJ/cm$^2$, the number of pulses at 10, a total energy of 0.45 J/cm$^2$ and overlapping ratio at 90%, there was obtained Jc=1.2 MA/cm$^2$ by the inductive method.

Example 11

With a YBCO film about 100 nm in film thickness produced in the same way as in the case of Example 1 except that the irradiation was executed with the intensity of laser light of 43 mJ/cm$^2$, the number of pulses at 100 and a total energy of 4.3 J/cm$^2$, there was obtained Jc=1 MA/cm$^2$ by the inductive method.

Reference Example 1

With a YBCO film about 100 nm in film thickness produced in the same way as in the case of Example 1 except that irradiation was executed with the intensity of laser light of 7 mJ/cm$^2$, the number of pulses at 500 and a total energy of 3.5 J/cm$^2$, Jc by the inductive method was found at the measurement limit (0.1 MA/cm$^2$) or lower.

Reference Example 2

With a YBCO film about 100 nm in film thickness produced in the same way as in the case of Example 1 except that irradiation was executed with the intensity of laser light of 15 mJ/cm$^2$, the number of pulses at 50, overlapping ratio at 98% and total energy of 0.75 J/cm$^2$, Jc by the inductive method was found at the measurement limit (0.1 MA/cm$^2$) or lower.

Reference Example 3

With a YBCO film about 100 nm in film thickness produced in the same way as in the case of Example 1 except that irradiation was executed with the intensity of laser light of 25 mJ/cm$^2$, the number of pulses at 2, overlapping ratio at 50% and a total energy of 0.05 J/cm$^2$, Jc by the inductive method was found at the measurement limit (0.1 MA/cm$^2$) or lower.

Reference Example 4

With a film made of the solution of the organic compound of the metals forming the superconductive material produced in the same way as in the case of Example 1 except that irradiation was executed with the intensity of laser light of 10 mJ/cm$^2$, the number of pulses at 4000000 and a total energy of 40000 J/cm$^2$, it disappeared due to ablation, and there was not obtained a YBCO film.

Reference Example 5

With a film made of the solution of the organic compound of the metals forming the superconductive material produced in the same way as in the case of Example 1 except that irradiation was executed with the intensity of laser light of 35 mJ/cm$^2$, the number of pulses at 10000 and a total energy of 350 J/cm$^2$, it disappeared due to ablation, and there was not obtained a YBCO film.

Reference Example 6

With a film made of the solution of the organic compound of the metals forming the superconductive material produced in the same way as in the case of Example 1 except that irradiation was executed with the intensity of laser light of 45 mJ/cm$^2$, the number of pulses at 300 and total energy of 13.5 J/cm$^2$, it disappeared due to ablation, and there was not obtained a YBCO film.

Example 12

With a $Y_{0.95}Ca_{0.05}Ba_2Cu_3O_7$ film about 100 nm in film thickness produced in the same way as in the case of Example 1 except that use was made of the coating solution YC1, and irradiation was executed with the intensity of laser light of 10 mJ/cm$^2$, the number of pulses at 2000 and a total energy of 20 J/cm$^2$, there was obtained Jc=1 MA/cm$^2$ by the inductive method.

Example 13

With a YBCO film about 100 nm in film thickness produced in the same way as in the case of Example 1 except that use was made of the coating solution Y2 and the substrate K2, and irradiation was executed with the intensity of laser light of 15 mJ/cm$^2$, the number of pulses at 5000 and a total energy of 75 J/cm$^2$, there was obtained Jc=3.1 MA/cm$^2$ by the inductive method.

Example 14

With a YBCO film about 100 nm in film thickness produced in the same way as in the case of Example 1 except that use was made of the coating solution Y3 and the substrate K3, and irradiation was executed with the intensity of laser light of 10 mJ/cm$^2$, the number of pulses at 100000 and a total energy of 1000 J/cm$^2$, there was obtained Jc=3.2 MA/cm$^2$ by the inductive method.

Example 15

With a YBCO film about 100 nm in film thickness produced in the same way as in the case of Example 1 except that use was made of the coating solution Y4 and the substrate K4, and irradiation was executed with the intensity of laser light of 15 mJ/cm$^2$, the number of pulses at 10000 and a total energy of 150 J/cm$^2$, there was obtained Jc=2.2 MA/cm$^2$ by the inductive method.

Example 16

With a YBCO film about 100 nm in film thickness produced in the same way as in the case of Example 1 except that use was made of the coating solution Y5 and the substrate K5, and irradiation was executed with the intensity of laser light of 20 mJ/cm$^2$, the number of pulses at 100 and a total energy of 2 J/cm$^2$, there was obtained Jc=1.2 MA/cm$^2$ by the inductive method.

Example 17

With a $DyBa_2Cu_3O_7$ film about 100 nm in film thickness produced in the same way as in the case of Example 1 except that use was made of the coating solution D1 and the substrate KC2, and irradiation was executed with the intensity of laser light of 20 mJ/cm$^2$, the number of pulses at 2000 and a total energy of 40 J/cm$^2$, there was obtained Jc=0.8 MA/cm$^2$ by the inductive method.

Example 18

With a $ErBa_2Cu_3O_7$ film about 100 nm in film thickness produced in the same way as in the case of Example 1 except that use was made of the coating solution E1 and the substrate KC3, and irradiation was executed with the intensity of laser light of 25 mJ/cm$^2$, the number of pulses at 3000 and a total energy of 75 J/cm$^2$, there was obtained Jc=1.0 MA/cm$^2$ by the inductive method.

Example 19

With a YBCO film about 100 nm in film thickness produced in the same way as in the case of Example 1 except that use was made of the substrate KC4 and the laser light H2, and irradiation was executed with the intensity of laser light of 20 mJ/cm$^2$, the number of pulses at 20000 and a total energy of 400 J/cm$^2$, there was obtained Jc=4.2 MA/cm$^2$ by the inductive method.

Example 20

With a YBCO film about 100 nm in film thickness produced in the same way as in the case of Example 1 except that use was made of the substrate KC5 and the laser light H3, and irradiation was executed with the intensity of laser light of 30 mJ/cm$^2$, the number of pulses at 3000 and a total energy of 90 J/cm$^2$, there was obtained Jc=3.2 MA/cm$^2$ by the inductive method.

Example 21

With a YBCO film about 100 nm in film thickness produced in the same way as in the case of Example 1 except that use was made of the substrate KC6, and irradiation was executed with the intensity of laser light of 35 mJ/cm$^2$, the number of pulses at 100 and a total energy of 3.5 J/cm$^2$, there was obtained Jc=0.8 MA/cm$^2$ by the inductive method.

Example 22

With a YBCO film about 100 nm in film thickness produced in the same way as in the case of Example 1 except that use was made of the substrate KC7, and irradiation was executed with the intensity of laser light of 35 mJ/cm$^2$, the number of pulses at 1000 and a total energy of 35 J/cm$^2$, there was obtained Jc=4.0 MA/cm$^2$ by the inductive method.

Example 23

With a YBCO film about 100 nm in film thickness produced in the same way as in the case of Example 1 except that use was made of the substrate KC8, and irradiation was executed with the intensity of laser light of 30 mJ/cm$^2$, the number of pulses at 1000 and a total energy of 30 J/cm$^2$, a critical current density Jc=3.0 MA/cm$^2$ by the inductive method was obtained.

It was found from the embodiments 1 to 23 that an excellent Jc was obtained in the irradiation condition area shown in FIG. 6.

Calculating the total energy in the irradiation condition area shown in FIG. 6, it was in the range of the following inequality.

0.03 J/cm$^2$≤total energy≤89000 J/cm$^2$

Example 24

A surface of the substrate KC1 was spin-coated at 4000 rpm with the coating solution Y1 for 10 seconds, and was dried at 130° C. in a constant-temperature oven for removal of a solvent and subsequently irradiated at room temperature by causing the laser light H1 to scan in the longitudinal direction. Provided, however, that the substrate KC1 was irradiated with the laser light H1, from a surface thereof, opposite from the surface coated with a solution of an organic compound of metals for constituting a superconductive material. The substrate constant of the substrate KC1 was 12.0. The irradiation conditions were as follows:
room temperature, in the ambient atmosphere;
irradiated with the laser light H1 from the surface thereof, opposite from the surface coated with the solution.
intensity of laser light: 74 mJ/cm$^2$
frequency: 100 Hz
overlapping ratio: 99%
the number of pulses: 30000
total energy: 20 J/cm$^2$ Subsequently, a specimen of the substrate KC1, subjected to the irradiation with the laser light, was inserted into a muffle oven kept at 500° C. beforehand, and was kept at that temperature for 30 minutes before being taken out. Thereafter, main baking was applied thereto in a quartz furnace tubular in shape under the following condition.

First, the specimen in a flow of a mixed gas of argon and oxygen with a partial pressure of oxygen adjusted at 100 ppm was heated up to 770° C. at a heating rate of about 16° C./min, and that temperature was kept for 45 minutes before the gas was changed over to pure oxygen to be then held for a further 30 minutes, after which the specimen was slowly cooled. FIG. 5 shows a temperature profile in those process steps described. With a YBCO film about 100 nm in film thickness produced as above, a critical current density Jc=7.6 MA/cm$^2$ by an inductive method was obtained. This represented an excellent value considerably in excess of 2.0 to 3.0 MA/cm$^2$, which is regarded as a level in practical use.

The surface of a coated film after irradiated with the laser light was observed with an optical microscope, and as a result, rhombus-like cracks on the order of 10 μm were observed. The cause of the development of the rhombus-like cracks was presumed that intramolecular bonds of organic compounds (acetylacetonate of metal elements constituting YBCO and residual solvent such as pyridine, methanol and propionic acid) constituting the coated film were cleaved by irradiation with ultraviolet laser light to thereby cause reaction with oxygen in the ambient atmosphere, and low molecular weight compounds ($H_2O$, $CO_2$, CO, etc.) formed underwent inflation and spouting by laser heating.

Example 25

With a YBCO film about 100 nm in film thickness produced in the same way as in the case of Example 24 except that the irradiation with the laser light was not executed, Jc by the inductive method was found at the measurement limit (0.1 MA/cm$^2$) or lower.

Example 26

With a YBCO film about 100 nm in film thickness produced in the same way as in the case of Example 24 except that irradiation was executed with the intensity of laser light of 10 mJ/cm$^2$, the number of pulses at 10000 and a total energy of 100 J/cm$^2$, there was obtained Jc=0.8 MA/cm$^2$ by the inductive method.

Example 27

With a YBCO film about 100 nm in film thickness produced in the same way as in the case of Example 24 except that irradiation was executed with the intensity of laser light of 7 mJ/cm$^2$, the number of pulses at 1000000 and a total energy of 7000 J/cm$^2$, there was obtained Jc=7.1 MA/cm$^2$ by the inductive method.

Example 28

With a YBCO film about 100 nm in film thickness produced in the same way as in the case of Example 24 except that irradiation was executed with the intensity of laser light of 10 mJ/cm$^2$, the number of pulses at 50000000 and a total energy of 500000 J/cm$^2$, there was obtained Jc=6.2 MA/cm$^2$ by the inductive method.

Example 29

With a YBCO film about 100 nm in film thickness produced in the same way as in the case of Example 24 except that irradiation was executed with the intensity of laser light of 60 mJ/cm$^2$, the number of pulses at 400 and a total energy of 24 J/cm$^2$, there was obtained Jc=0.8 MA/cm$^2$ by the inductive method.

Example 30

With a YBCO film about 100 nm in film thickness produced in the same way as in the case of Example 24 except that irradiation was executed with the intensity of laser light of 65 mJ/cm$^2$, the number of pulses at 30000 and a total energy of 1950 J/cm$^2$, there was obtained Jc=6.9 MA/cm$^2$ by the inductive method.

Example 31

With a YBCO film about 100 nm in film thickness produced in the same way as in the case of Example 24 except that irradiation was executed with the intensity of laser light of 70 mJ/cm$^2$, the number of pulses at 500000 and a total energy of 35000 J/cm$^2$, there was obtained Jc=4.8 MA/cm$^2$ by the inductive method.

Example 32

With a YBCO film about 100 nm in film thickness produced in the same way as in the case of Example 24 except that irradiation was executed with the intensity of laser light of 110 mJ/cm$^2$, the number of pulses at 100 and a total energy of 11 J/cm$^2$, there was obtained Jc=0.8 MA/cm$^2$ by the inductive method.

Example 33

With a YBCO film about 100 nm in film thickness produced in the same way as in the case of Example 24 except that irradiation was executed with the intensity of laser light of 100 mJ/cm$^2$, the number of pulses at 3000 and a total energy of 300 J/cm$^2$, there was obtained Jc=0.7 MA/cm$^2$ by the inductive method.

Example 34

With a YBCO film about 100 nm in film thickness produced in the same way as in the case of Example 24 except that irradiation was executed with the intensity of laser light of 110 mJ/cm$^2$, the number of pulses at 40000 and a total energy of 4400 J/cm$^2$, there was obtained Jc=6.5 MA/cm$^2$ by the inductive method.

Reference Example 7

With a YBCO film about 100 nm in film thickness produced in the same way as in the case of Example 24 except that irradiation was executed with the intensity of laser light of 10 mJ/cm$^2$, the number of pulses at 1000 and a total energy of 10 J/cm$^2$, Jc by the inductive method was found at the measurement limit (0.1 MA/cm$^2$) or lower.

Reference Example 8

With a YBCO film about 100 nm in film thickness produced in the same way as in the case of Example 24 except that irradiation was executed with the intensity of laser light of 50 mJ/cm$^2$, the number of pulses at 100 and a total energy of 5 J/cm$^2$, Jc by the inductive method was found at the measurement limit (0.1 MA/cm$^2$) or lower.

Reference Example 9

With a YBCO film about 100 nm in film thickness produced in the same way as in the case of Example 24 except that irradiation was executed with the intensity of laser light of 100 mJ/cm$^2$, the number of pulses at 2, an overlapping ratio at 50% and a total energy of 0.2 J/cm$^2$, Jc by the inductive method was found at the measurement limit (0.1 MA/cm$^2$) or lower.

Reference Example 10

With a film made of the solution of the organic compound of the metals forming the superconductive material produced in the same way as in the case of Example 24 except that irradiation was executed with the intensity of laser light of 20 mJ/cm$^2$, the number of pulses at 100000000 and a total energy of 2000000 J/cm$^2$, it disappeared due to ablation and there was not obtained a YBCO film.

Reference Example 11

With a film made of the solution of the organic compound of the metals forming the superconductive material produced in the same way as in the case of Example 24 except that irradiation was executed with the intensity of laser light of 70 mJ/cm$^2$, the number of pulses at 10000000 and a total energy of 700000 J/cm$^2$, it disappeared due to ablation, and there was not obtained a YBCO film.

Reference Example 12

With a film made of the solution of the organic compound of the metals forming the superconductive material produced in the same way as in the case of Example 24 except that irradiation was executed with the intensity of laser light of 110 mJ/cm$^2$ and the number of pulses at 300000, a total energy of 33000 J/cm$^2$, it disappeared due to ablation, and there was not obtained a YBCO film.

Example 35

With a $Y_{0.95}Ca_{0.05}Ba_2Cu_3O_7$ film about 100 nm in film thickness produced in the same way as in the case of Example 24 except that use was made of the coating solution YC1 and irradiation was executed with the intensity of laser light of 40 mJ/cm$^2$, the number of pulses at 10000 and a total energy of 400 J/cm$^2$, there was obtained Jc=2 MA/cm$^2$ by the inductive method.

Example 36

With a YBCO film about 100 nm in film thickness produced in the same way as in the case of Example 24 except that use was made of the coating solution Y2 and irradiation was executed with the intensity of laser light of 40 mJ/cm$^2$, the number of pulses at 100000 and a total energy of 4000 J/cm$^2$, there was obtained Jc=6 MA/cm$^2$ by the inductive method.

Example 37

With a YBCO film about 100 nm in film thickness produced in the same way as in the case of Example 24 except that use was made of the coating solution Y3 and irradiation was executed with the intensity of laser light of 100 mJ/cm$^2$, the number of pulses at 100 and a total energy of 10 J/cm$^2$, there was obtained Jc=0.8 MA/cm$^2$ by the inductive method.

Example 38

With a YBCO film about 100 nm in film thickness produced in the same way as in the case of Example 24 except that use was made of the coating solution Y4 and irradiation was executed with the intensity of laser light of 100 mJ/cm$^2$, the number of pulses at 30000 and a total energy of 3000 J/cm$^2$, there was obtained Jc=6.7 MA/cm$^2$ by the inductive method.

Example 39

With a YBCO film about 100 nm in film thickness produced in the same way as in the case of Example 24 except that use was made of the coating solution Y5 and irradiation was executed with the intensity of laser light of 80 mJ/cm$^2$, the number of pulses at 10000 and a total energy of 800 J/cm$^2$, there was obtained Jc=4.0 MA/cm$^2$ by the inductive method.

Example 40

With a DyBa$_2$Cu$_3$O$_7$ film about 100 nm in film thickness produced in the same way as in the case of Example 24 except that use was made of the coating solution D1 and irradiation was executed with the intensity of laser light of 80 mJ/cm$^2$, the number of pulses at 50000 and a total energy of 4000 J/cm$^2$, there was obtained Jc=1.5 MA/cm$^2$ by the inductive method.

Example 41

With a ErBa$_2$Cu$_3$O$_7$ film about 100 nm in film thickness produced in the same way as in the case of Example 24 except that use was made of the coating solution E1 and irradiation was executed with the intensity of laser light of 100 mJ/cm$^2$, the number of pulses at 10000 and a total energy of 1000 J/cm$^2$, there was obtained Jc=1.0 MA/cm$^2$ by the inductive method.

It was found from the embodiments 24 to 41 that an excellent Jc was obtained in the irradiation condition area shown in FIG. 7.

Calculating the total energy in the irradiation condition area shown in FIG. 7, it was in the range of the following inequality.

$$0.36 \text{ J/cm}^2 \leq \text{total energy} \leq 1068000 \text{ J/cm}^2$$

Example 42

A surface of the substrate K1 was spin-coated at 4000 rpm with the coating solution Y1 for 10 seconds, and was dried at 130° C. in a constant-temperature oven for removal of a solvent and subsequently irradiated at room temperature by causing the laser light H1 to scan in the longitudinal direction. Provided, however, that the substrate K1 was irradiated with the laser light H1 from a surface thereof, opposite from the surface coated with a solution of an organic compound of metals for forming a superconductive material. The substrate constant of the substrate K1 was 18.8. Irradiation conditions were as follows:
room temperature, in the ambient atmosphere;
irradiated with the laser light H1 from the surface thereof, opposite from the surface coated with the solution.
intensity of laser light: 80 mJ/cm$^2$
frequency: 100 Hz
overlapping ratio: 99%
the number of pulses: 50000
total energy: 4000 J/cm$^2$ Subsequently, a specimen of the substrate K1, subjected to the irradiation with the laser light, was inserted into a muffle oven kept at 500° C. beforehand, and was kept at that temperature for 30 minutes before being taken out. Thereafter, main baking was applied thereto in a quartz furnace tubular in shape under the following condition.

First, the specimen in a flow of a mixed gas of argon and oxygen with a partial pressure of oxygen adjusted at 100 ppm was heated up to 770° C. at a heating rate of about 16° C./min, and that temperature was kept for 45 minutes before the gas was changed over to pure oxygen to be then held for a further 30 minutes, after which the specimen was slowly cooled. FIG. 5 shows a temperature profile in those process steps described. With a YBCO film about 100 nm in film thickness produced as above, a critical current density Jc=8.2 MA/cm$^2$ by an inductive method was obtained. This represented an excellent value considerably in excess of 2.0 to 3.0 MA/cm$^2$, which is regarded as a level in practical use.

The surface of a coated film after being irradiated with the laser light was observed with an optical microscope, and as a result, rhombus-like cracks on the order of 10 μm were observed. The cause of the development of the rhombus-like cracks was presumed that intramolecular bonds of organic compounds (acetylacetonate of metal elements constituting YBCO and residual solvent such as pyridine, methanol and propionic acid) constituting the coated film were cleaved by irradiation with ultraviolet laser light to thereby cause a reaction with oxygen in the ambient atmosphere, and low molecular weight compounds (H$_2$O, CO$_2$, CO, etc.) formed underwent inflation and spouting by laser heating.

Example 43

With a YBCO film about 100 nm in film thickness produced in the same way as in the case of Example 42 except that irradiation with the laser beam was not executed, Jc by the inductive method was found at the measurement limit (0.1 MA/cm$^2$) or lower.

Example 44

With a YBCO film about 100 nm in film thickness produced in the same way as in the case of Example 42 except that irradiation was executed with the intensity of laser light of 10 mJ/cm$^2$, the number of pulses at 1000 and a total energy of 10 J/cm$^2$, there was obtained Jc=0.8 MA/cm$^2$ by the inductive method.

Example 45

With a YBCO film about 100 nm in film thickness produced in the same way as in the case of Example 42 except that irradiation was executed with the intensity of laser light of 10 mJ/cm$^2$, the number of pulses at 100000 and a total energy of 1000 J/cm$^2$, there was obtained Jc=6.1 MA/cm$^2$ by the inductive method.

Example 46

With a YBCO film about 100 nm in film thickness produced in the same way as in the case of Example 42 except that irradiation was executed with the intensity of laser light of 20 mJ/cm$^2$, the number of pulses at 80000000 and a total energy of 1600000 J/cm$^2$, there was obtained Jc=3.4 MA/cm$^2$ by the inductive method.

Example 47

With a YBCO film about 100 nm in film thickness produced in the same way as in the case of Example 42 except that irradiation was executed with the intensity of laser light of 90 mJ/cm$^2$, the number of pulses at 100 and a total energy of 9 J/cm$^2$, there was obtained Jc=0.8 MA/cm$^2$ by the inductive method.

Example 48

With a YBCO film about 100 nm in film thickness produced in the same way as in the case of Example 42 except that irradiation was executed with the intensity of laser light of 90 mJ/cm$^2$, the number of pulses at 10000000 and a total energy of 900000 J/cm$^2$, there was obtained Jc=4.8 MA/cm$^2$ by the inductive method.

Example 49

With a YBCO film about 100 nm in film thickness produced in the same way as in the case of Example 42 except that irradiation was executed with the intensity of laser light of 180 mJ/cm$^2$, the number of pulses at 100 and a total energy of 18 J/cm$^2$, there was obtained Jc=0.9 MA/cm$^2$ by the inductive method.

Example 50

With a YBCO film about 100 nm in film thickness produced in the same way as in the case of Example 42 except that irradiation was executed with the intensity of laser light of 170 mJ/cm$^2$, the number of pulses at 50000 and a total energy of 8500 J/cm$^2$, there was obtained Jc=7.4 MA/cm$^2$ by the inductive method.

Example 51

With a YBCO film about 100 nm in film thickness produced in the same way as in the case of Example 42 except that irradiation was executed with the intensity of laser light of 180 mJ/cm$^2$, the number of pulses at 1000000 and a total energy of 180000 J/cm$^2$, there was obtained Jc=5.2 MA/cm$^2$ by the inductive method.

Example 52

With a YBCO film about 100 nm in film thickness produced in the same way as in the case of Example 42 except that irradiation was executed with the intensity of laser light of 100 mJ/cm$^2$, the number of pulses at 30000 and a total energy of 3000 J/cm$^2$, there was obtained Jc=6.0 MA/cm$^2$ by the inductive method.

Reference Example 13

With a YBCO film about 100 nm in film thickness produced in the same way as in the case of Example 42 except that irradiation was executed with the intensity of laser light of 10 mJ/cm$^2$, the number of pulses at 100 and a total energy of 1.0 J/cm$^2$, Jc by the inductive method was found at the measurement limit (0.1 MA/cm$^2$) or lower.

Reference Example 14

With a YBCO film about 100 nm in film thickness produced in the same way as in the case of Example 42 except that irradiation was executed with the intensity of laser light of 70 mJ/cm$^2$, the number of pulses at 20, an overlapping ratio at 90% and a total energy of 1.4 J/cm$^2$, Jc by the inductive method was found at the measurement limit (0.1 MA/cm$^2$) or lower.

Reference Example 15

With a YBCO film about 100 nm in film thickness produced in the same way as in the case of Example 42 except that irradiation was executed with the intensity of laser light of 180 mJ/cm$^2$, the number of pulses at 2, an overlapping ratio at 50% and a total energy of 0.36 J/cm$^2$, Jc by the inductive method was found at the measurement limit (0.1 MA/cm$^2$) or lower.

Reference Example 16

With a film made of the solution of the organic compound of the metals forming the superconductive material produced in the same way as in the case of Example 42 except that irradiation was executed with the intensity of laser light of 30 mJ/cm$^2$, the number of pulses at 300000000 and a total energy of 9000000 J/cm$^2$, it disappeared due to ablation, and there was not obtained a YBCO film.

Reference Example 17

With a film made of the solution of the organic compound of the metals forming the superconductive material produced in the same way as in the case of Example 42 except that irradiation was executed with the intensity of laser light of 100 mJ/cm$^2$, the number of pulses at 60000000 and a total energy of 6000000 J/cm$^2$, it disappeared due to ablation, and there was not obtained a YBCO film.

Reference Example 18

With a film made of the solution of the organic compound of the metals forming the superconductive material produced in the same way as in the case of Example 42 except that irradiation was executed with the intensity of laser light of 170 mJ/cm$^2$, the number of pulses at 20000000 and a total energy of 3400000 J/cm$^2$, it disappeared due to ablation, and there was not obtained a YBCO film.

Example 53

With a $Y_{0.95}Ca_{0.05}Ba_2Cu_3O_7$ film about 100 nm in film thickness produced in the same way as in the case of Example 42 except that use was made of the coating solution YC1 and irradiation was executed with the intensity of laser light of 40 mJ/cm$^2$ and the number of pulses at 30000, there was obtained Jc=3 MA/cm$^2$ by the inductive method.

Example 54

With a YBCO film about 100 nm in film thickness produced in the same way as in the case of Example 42 except that use was made of the coating solution Y2 and irradiation was executed with the intensity of laser light of 50 mJ/cm$^2$, the number of pulses at 30000 and a total energy of 1500 J/cm$^2$, there was obtained Jc=3.4 MA/cm$^2$ by the inductive method.

Example 55

With a YBCO film about 100 nm in film thickness produced in the same way as in the case of Example 42 except that use was made of the coating solution Y3 and irradiation was executed with the intensity of laser light of 70 mJ/cm$^2$, the number of pulses at 100000 and a total energy of 7000 J/cm$^2$, there was obtained Jc=3.5 MA/cm$^2$ by the inductive method.

Example 56

With a YBCO film about 100 nm in film thickness produced in the same way as in the case of Example 42 except that use was made of the coating solution Y4 and irradiation was executed with the intensity of laser light of 100 mJ/cm², the number of pulses at 10000 and a total energy of 1000 J/cm², there was obtained Jc=1.5 MA/cm² by the inductive method.

Example 57

With a YBCO film about 100 nm in film thickness produced in the same way as in the case of Example 42 except that use was made of the coating solution Y5 and irradiation was executed with the intensity of laser light of 100 mJ/cm², the number of pulses at 200000 and a total energy of 20000 J/cm², there was obtained Jc=4.0 MA/cm² by the inductive method.

Example 58

With a $DyBa_2Cu_3O_7$ film about 100 nm in film thickness produced in the same way as in the case of Example 42 except that use was made of the coating solution D1 and irradiation was executed with the intensity of laser light of 150 mJ/cm², the number of pulses at 10000 and a total energy of 1500 J/cm², there was obtained Jc=1.0 MA/cm² by the inductive method.

Example 59

With a $ErBa_2Cu_3O_7$ film about 100 nm in film thickness produced in the same way as in the case of Example 42 except that use was made of the coating solution E1 and irradiation was executed with the intensity of laser light of 150 mJ/cm², the number of pulses at 30000 and a total energy of 4500 J/cm², there was obtained Jc=1.4 MA/cm² by the inductive method.

It was found from the embodiments 42 to 59 that an excellent Jc was obtained in the irradiation condition area shown in FIG. 8.

Calculating the total energy in the irradiation condition area shown in FIG. 8, it was in the range of the following inequality.

$$0.6 \text{ J/cm}^2 \le \text{total energy} \le 1673000 \text{ J/cm}^2$$

INDUSTRIAL APPLICABILITY

Since the method of producing a superconductive material according to the invention is superior in production efficiency, suitable for mass production capable of providing a superconductive material having an excellent superconductivity and large area, the method has technical significance important for commercialization of the superconductive material, so that it has a high industrial applicability.

The invention claimed is:

1. A method of producing a superconductive material, comprising the steps of:
    providing a solution of an organic compound of metals whose oxides form a superconductive material;
    applying the solution onto a surface of a support body;
    irradiating a surface of the support body opposite to the surface on which the solution was applied with a laser light;
    conducting a provisional baking step to cause organic components of the organic compound to undergo thermal decomposition and form oxides of the metals; and
    conducting a main baking step to cause the oxides of the metals to transform into the superconductive material and produce an epitaxially-grown superconductive coating material,
    wherein the laser irradiation is conducted under the following conditions:

$5 \text{ mJ/cm}^2 \le \text{intensity of the laser light } F \le 200 \text{ mJ/cm}^2$;

$1 \le \text{number of pulses } P \le 198,000,000$;

$0.03 \text{ J/cm}^2 \times \text{a substrate constant} \le \text{total energy} \le 89000$ J/cm²×a substrate constant, where a substrate constant is defined as a number not less than 1 and dependent on the nature and thickness of the support body; and
    an irradiation condition area is bounded by straight lines having the following equations $$\log_{10}P = K^1F + K^2$$

$$\log_{10}P = K^1F + K^3,$$

where $K^1$ is the slope of a line between a point F corresponding to an arbitrary point P where transformation into the superconductive material first occurs and a point P corresponding to an arbitrary point F where transformation into the superconductive material occurs first, $K^2$ is a logarithmic value at the point P in F=O where a value at the point P in F=5 where transformation into the superconductive material occurs first is outwardly inserted along the slope $K^1$ and $K^3$ is a logarithmic value at the point P in F=O where a value at the point P in F=5 where ablation first occurs is outwardly inserted along the slope $K^1$, where $K^3 > K^2$ is established.

2. The method according to claim 1, wherein the support body is a single crystal substrate selected from the group consisting of a $LaAlO_3$ substrate, a $SrTiO_3$ substrate, a $NdGaO_3$ substrate, a lanthanum-strontium-tantalum-aluminum oxide substrate and a $YAlO_3$ substrate.

3. The method according to claim 1, wherein the support body is a single crystal substrate, selected from the group consisting of an $Al_2O_3$ substrate, a yttria-stabilized zirconia substrate, a MgO substrate, a $LaAlO_3$ substrate, a $SrTiO_3$ substrate, a lanthanum-strontium-tantalum-aluminum oxide substrate, a $NdGaO_3$ substrate and a $YAlO_3$ substrate, having a $CeO_2$ buffer layer formed thereon.

4. The method according to claim 1, wherein as metals, selection is made of at least one element selected from the group consisting of Y and rare earth elements and alkaline earth metals, respectively, and Cu.

5. The method according to claim 1, wherein the organic compound of the metal is at least one organic compound selected from the group consisting of β-diketonate, metal-alkoxides and metal salts of organic acids.

6. The method according to claim 1, wherein the organic compound of the metals is selected from the group consisting of β-diketonate, metal-alkoxides and metal salts of organic acids containing a halogen.

7. The method according to claim 1, wherein irradiation of a surface of the support body opposite to the surface coated with the solution of the organic compound of metals is implemented with laser light and the support body is a single crystal substrate selected from the group consisting of $LaAlO_3$ and $YAlO_3$.

8. The method according to claim 1, wherein irradiation of a surface of the support body opposite to the surface coated with the solution of the organic compound of metals is implemented with laser light and the support body is a substrate with a CeO$_2$ buffer layer formed on a single crystal substrate selected from the group consisting of Al$_2$O$_3$ and MgO.

9. The method according to claim 7, wherein the metals are selected from the group consisting of Y and rare earth elements and alkaline earth metals, respectively, and Cu.

10. The method according to claim 7, wherein the organic compound of the metals is selected from the group consisting of β-diketonate, metal-alkoxides and metal salts of organic acids.

11. The method according to claim 7, wherein the organic compound of the metals is selected from the group consisting of β-diketonate, metal-alkoxides and metal salts of organic acids containing a halogen.

* * * * *